(12) United States Patent
Li et al.

(10) Patent No.: US 12,446,313 B2
(45) Date of Patent: Oct. 14, 2025

(54) ARRAY SUBSTRATE, METHOD FOR MANUFACTURING ARRAY SUBSTRATE, AND DISPLAY DEVICE

(71) Applicant: Guangzhou China Star Optoelectronics Semiconductor Display Technology Co., Ltd., Guangzhou (CN)

(72) Inventors: Shan Li, Guangzhou (CN); Wei Wu, Guangzhou (CN); Juncheng Xiao, Guangzhou (CN)

(73) Assignee: Guangzhou China Star Optoelectronics Semiconductor Display Technology Co., Ltd., Guangzhou (CN)

( * ) Notice: Subject to any disclaimer, the term of this patent is extended or adjusted under 35 U.S.C. 154(b) by 0 days.

(21) Appl. No.: 17/777,035

(22) PCT Filed: Mar. 29, 2022

(86) PCT No.: PCT/CN2022/083634
§ 371 (c)(1),
(2) Date: May 15, 2022

(87) PCT Pub. No.: WO2023/168768
PCT Pub. Date: Sep. 14, 2023

(65) Prior Publication Data
US 2025/0089361 A1 Mar. 13, 2025

(30) Foreign Application Priority Data
Mar. 10, 2022 (CN) .......................... 202210230045.2

(51) Int. Cl.
*H10D 86/01* (2025.01)
*H10D 86/40* (2025.01)
*H10D 86/60* (2025.01)

(52) U.S. Cl.
CPC ......... *H10D 86/60* (2025.01); *H10D 86/0221* (2025.01); *H10D 86/423* (2025.01)

(58) Field of Classification Search
CPC .. H10D 86/60; H10D 86/0221; H10D 86/423; H10D 86/021; H10D 30/6755; G02F 1/1368
See application file for complete search history.

(56) References Cited

U.S. PATENT DOCUMENTS 9,614,098 B2 * 4/2017 Zhao ...................... H01L 21/426
10,304,966 B2 * 5/2019 Zhai ..................... H10D 30/6755
(Continued)

FOREIGN PATENT DOCUMENTS

| CN | 101257048 A | 9/2008 |
| CN | 101473444 A | 7/2009 |

(Continued)

OTHER PUBLICATIONS

International Search Report in International application No. PCT/CN2022/083634, mailed on Nov. 30, 2022.
(Continued)

*Primary Examiner* — William B Partridge
*Assistant Examiner* — Erik A. Anderson
(74) *Attorney, Agent, or Firm* — Nathan & Associates Patent Agents Ltd.; Menachem Nathan

(57) ABSTRACT

The present disclosure provides an array substrate, a method for manufacturing the array substrate, and a display device. The array substrate includes a substrate, a gate electrode, and an oxide semiconductor layer. Material of the oxide semiconductor layer includes a modified metal element. Proportion of the modified metal element in all metal elements gradually decreases from the gate electrode to the
(Continued)

oxide semiconductor layer, which can solve technical problems of poor stability and low mobility of a metal oxide thin film transistor.

16 Claims, 5 Drawing Sheets

(56) References Cited

U.S. PATENT DOCUMENTS

2013/0256666 A1* 10/2013 Chang ............... H10D 30/6756
                                                            438/158
2019/0067469 A1    2/2019 Hu

FOREIGN PATENT DOCUMENTS

| CN | 103840011 A | * | 6/2014 | ............. H01L 29/22 |
| CN | 112514079 A | | 3/2021 | |
| CN | 114008793 A | | 2/2022 | |

OTHER PUBLICATIONS

Written Opinion of the International Search Authority in International application No. PCT/CN2022/083634, mailed on Nov. 30, 2022.

* cited by examiner

ARRAY SUBSTRATE, METHOD FOR MANUFACTURING ARRAY SUBSTRATE, AND DISPLAY DEVICE

FIELD OF INVENTION

The present disclosure relates to a technical field of display, and especially to an array substrate, a method for manufacturing the array substrate, and a display device.

BACKGROUND OF INVENTION

With development of display panel towards larger size, higher resolution, higher frequency and self-luminous display modes (organic light-emitting display (OLED), mini light emitting display (Mini LED), micro light emitting display (Micro LED)), higher and higher requirements are put forward for mobility and stability of thin film transistors (TFTs) that control switches and drive displays. At present, amorphous silicon thin film transistors commonly used in display industry have low mobility and low on-state current (Ion), which cannot meet requirements of high-end display products (embodied by insufficient LCD charging, or insufficient brightness of OLED, Mini LED, and Micro LED). Mobility of metal oxide thin film transistors, which are as high as 10-100 times that of the amorphous silicon thin film transistors, can meet the needs of new high-end display products. As a result, metal oxide thin film transistors and their display panels have received more and more attention from the industry.

However, compared with low temperature polysilicon thin film transistors, the metal oxide thin film transistors have poor stability and low mobility.

SUMMARY OF INVENTION

Embodiments of the present disclosure provide an array substrate, a method for manufacturing the array substrate, and a display device, which can solve technical problems of poor stability and low mobility of metal oxide thin film transistors.

An embodiment of the present disclosure provides an array substrate, includes:
   a substrate;
   an oxide semiconductor layer;
   a gate electrode, the gate electrode and the oxide semiconductor layer arranged on a same side of the substrate, projection of the gate electrode and projection of the oxide semiconductor layer on the substrate at least partially overlapping, the gate electrode and the oxide semiconductor layer arranged at intervals;
   wherein, material of the oxide semiconductor layer includes modified metal element, proportion of the modified metal element in all metal elements gradually decreases from the gate electrode toward the oxide semiconductor layer.

Optionally, in some embodiments of the present disclosure, the material of the oxide semiconductor layer is selected from at least one of aluminum zinc oxide and aluminum gallium zinc oxide;
   the modified metal element is aluminum, proportion of the aluminum in all the metal elements gradually decreases from the gate electrode toward the oxide semiconductor layer.

Optionally, in some embodiments of the present disclosure, the material of the oxide semiconductor layer is selected from at least one of indium zinc oxide, indium tin zinc oxide and indium gallium zinc oxide;
   the modified metal element is indium, proportion of the indium in all the metal elements gradually decreases from the gate electrode toward the oxide semiconductor layer.

Optionally, in some embodiments of the present disclosure, the gate electrode is disposed on the substrate, the array substrate further includes:
   a gate electrode insulating layer, disposed on the substrate and covering the gate electrode, the oxide semiconductor layer disposed on the gate electrode insulating layer and disposed corresponding to the gate electrode; and
   a source electrode and a drain electrode, arranged on the gate electrode insulating layer and the oxide semiconductor layer at intervals, the source electrode connecting with one end of the oxide semiconductor layer, the drain electrode connecting with another end of the oxide semiconductor layer.

Optionally, in some embodiments of the present disclosure, the oxide semiconductor layer is disposed on the substrate, the array substrate further includes:
   a gate electrode insulating layer, disposed on the oxide semiconductor layer, the gate electrode disposed on the gate electrode insulating layer;
   an interlayer insulating layer, covering the gate electrode, the gate electrode insulating layer, and the oxide semiconductor layer; and
   a source electrode and a drain electrode, disposed on the interlayer insulating layer, the source electrode connecting to one end of the oxide semiconductor layer, the drain electrode connecting to another end of the oxide semiconductor layer.

An embodiment of the present disclosure also provides a method for manufacturing an array substrate, includes the following steps:
   forming a diffusion layer on a substrate, the diffusion layer including modified metal element;
   forming a metal oxide layer on the substrate, the metal oxide layer covering the diffusion layer, material of the metal oxide layer including at least two metal elements;
   heat-treating the diffusion layer and the metal oxide layer, the modified metal element diffusing into the metal oxide layer so that proportion of the modified metal element in all metal elements in the metal oxide layer gradually decreases from the substrate toward the metal oxide layer, thereby obtaining an oxide semiconductor layer.

Optionally, in some embodiments of the present disclosure, the step of forming the diffusion layer on the substrate includes:
   forming a metal layer on the substrate, material of the metal layer including the modified metal element;
   heat-treating the metal layer, the metal layer converted into a plurality of metal particles and forming the diffusion layer.

Optionally, in some embodiments of the present disclosure, thickness of the metal layer is less than or equal to 10 nanometers.

Optionally, in some embodiments of the present disclosure, temperature ranging for heat-treatment of the metal layer is from 150 degrees Celsius to 350 degrees Celsius, time period ranging is from 10 minutes to 2 hours.

Optionally, in some embodiments of the present disclosure, the metal layer is an aluminum layer, the modified metal element is aluminum, and material of the metal oxide layer is selected from at least one of aluminum-zinc oxide and aluminum-gallium-zinc oxide.

Optionally, in some embodiments of the present disclosure, the metal layer is an indium layer, the modified metal element is indium, the material of the metal oxide layer is selected from at least one of indium zinc oxide, indium tin zinc oxide, and indium gallium zinc oxide.

Optionally, in some embodiments of the present disclosure, temperature ranging for heat-treatment of the diffusion layer and the metal oxide layer is from 250 degrees Celsius to 450 degrees Celsius, time period ranging is from 10 minutes to 2 hours.

Embodiments of the present disclosure also provide a method for manufacturing an array substrate, includes the following steps:

forming a metal oxide layer on a substrate, material of the metal oxide layer including at least two metal elements;

forming a diffusion layer on the metal oxide layer, the diffusion layer including modified metal element;

heat-treating the diffusion layer and the metal oxide layer, the modified metal element diffusing into the metal oxide layer so that proportion of the modified metal element in all metal elements in the metal oxide layer gradually decreases from the metal oxide layer toward the substrate, thereby obtaining an oxide semiconductor layer.

Optionally, in some embodiments of the present disclosure, the step of forming the diffusion layer on the metal oxide layer includes:

forming a metal layer on the metal oxide layer, material of the metal layer including the modified metal element;

heat-treating the metal layer, the metal layer converted into a plurality of metal particles and forming the diffusion layer.

Optionally, in some embodiments of the present disclosure, thickness of the metal layer is less than or equal to 10 nanometers.

Optionally, in some embodiments of the present disclosure, temperature ranging for heat-treating of the metal layer is from 150 degrees Celsius to 350 degrees Celsius, time period ranging is from 10 minutes to 2 hours.

Optionally, in some embodiments of the present disclosure, the metal layer is an aluminum layer, the modified metal element is aluminum, and material of the metal oxide layer is selected from at least one of aluminum-zinc oxide and aluminum-gallium-zinc oxide.

Optionally, in some embodiments of the present disclosure, the metal layer is an indium layer, the modified metal element is indium, and the material of the metal oxide layer is selected from at least one of indium zinc oxide, indium tin zinc oxide and indium gallium zinc oxide.

Optionally, in some embodiments of the present disclosure, temperature ranging for heat-treatment of the diffusion layer and the metal oxide layer is from 250 degrees Celsius to 450 degrees Celsius, time period ranging is from 10 minutes to 2 hours.

An embodiment of the present disclosure further provides a display device, the display device includes an opposing substrate, a liquid crystal layer, and the array substrate as described above, the opposing substrate and the array substrate are arranged at intervals, the liquid crystal layer is arranged between the opposing substrate and the array substrate.

The embodiments of the present disclosure adopt the array substrate, the method for manufacturing the array substrate, and the display device, by gradually decreasing the proportion of the modified metal elements in the oxide semiconductor layer in all metal elements from the gate electrode towards the direction of the oxide semiconductor layer, that is, the modified metal element of the oxide semiconductor layer forms a concentration gradient, content of the modified metal element on the side of the oxide semiconductor layer close to the gate electrode is relatively higher, which is beneficial to improve the mobility; content of the modified metal element on the side of the oxide semiconductor layer away from the gate electrode is relatively low, which is beneficial to improve the stability and achieve an effect of multi-layer metal oxide semiconductor.

BRIEF DESCRIPTION OF DRAWINGS

In order to more clearly illustrate the technical solutions in the embodiments of the present disclosure, the accompanying drawings that need to be used in the description of the embodiments will be briefly introduced below. Obviously, the drawings in the following description are only some embodiments of the present disclosure, for those skilled in the art, other drawings can also be obtained from these drawings without creative effort.

DETAILED DESCRIPTION OF PREFERRED EMBODIMENTS

Figure 1:
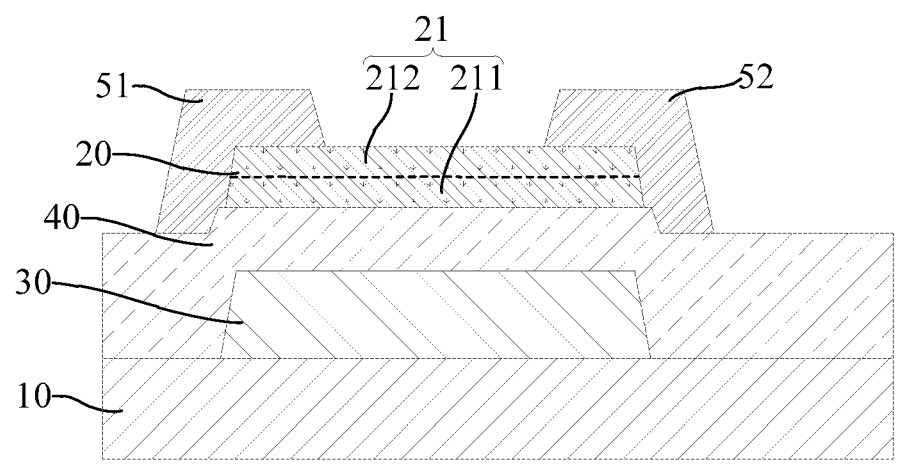
FIG. 1 is a cross-sectional schematic structural diagram of a first array substrate according to an embodiment of the present disclosure.

The technical solutions in the embodiments of the present disclosure will be clearly and completely described below with reference to the drawings in the embodiments of the present disclosure. Obviously, the described embodiments are only a part of the embodiments of the present disclosure, but not all of the embodiments. Based on the embodiments in the present disclosure, all other embodiments obtained by those skilled in the art without creative work fall within the protection scope of the present disclosure. In addition, it should be understood that the specific embodiments described herein are only used to illustrate and explain the present disclosure, but not to limit the present disclosure. In the present disclosure, unless otherwise stated, the directional words used such as "upper" and "lower" generally refer to the upper and lower sides of the device in actual use or working state, specifically the drawing direction in the accompanying drawings; while "inside" and "outside" refer to the outline of the device.

Embodiments of the present disclosure provide an array substrate, a method for manufacturing the array substrate, and a display device. Each of them will be described in detail below. It should be noted that the description order of the following embodiments is not intended to limit the preferred order of the embodiments.

Figure 2:
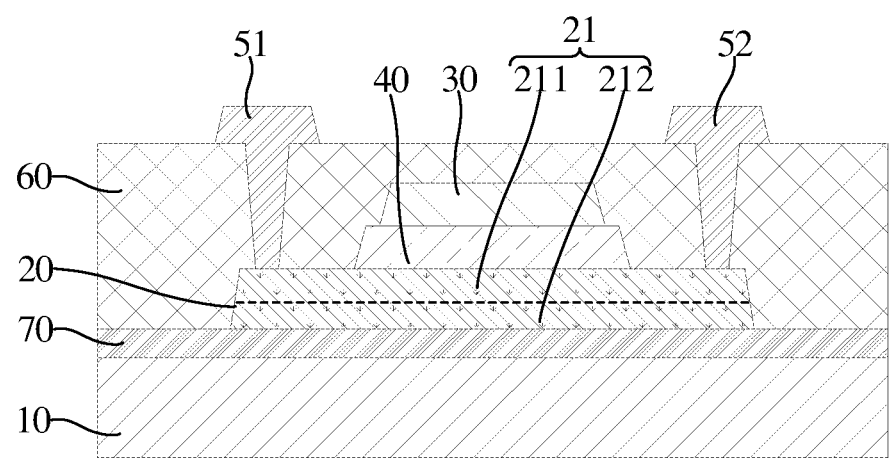
FIG. 2 is a cross-sectional schematic structural diagram of a second array substrate according to an embodiment of the present disclosure.

Please refer to FIG. 1 and FIG. 2, an embodiment of the present disclosure provides an array substrate including a substrate 10, a gate electrode 30, and an oxide semiconductor layer 20. The gate electrode 30 and the oxide semiconductor layer 20 are disposed on a same side of the substrate 10. Projection of the gate electrode 30 and projection of the oxide semiconductor layer 20 on the substrate 10 at least partially overlap. The gate electrode 30 and the oxide semiconductor layer 20 are arranged at intervals, that is, the gate electrode 30 and the oxide semiconductor layer 20 are arranged in different layer structures and an insulating layer is arranged between the gate electrode 30 and the oxide semiconductor layer 20. Wherein, material of the oxide semiconductor layer 20 includes a modified metal element, proportion of the modified metal element in all metal elements gradually decreases from the gate electrode 30 toward the oxide semiconductor layer 20. In the present embodiment, the material of the oxide semiconductor layer 20 includes at least two metal elements, one of the metal element is the modified metal element.

In the array substrate of the embodiment of the present disclosure, the proportion of the modified metal element in the oxide semiconductor layer 20 in all the metal elements gradually decreases from the gate electrode 30 toward the oxide semiconductor layer 20, that is, the modified metal element of the oxide semiconductor layer 20 forms a concentration gradient. Specifically, content of the modified metal element on a side of the oxide semiconductor layer 20 close to the gate electrode 30 is relatively high, which is beneficial to improve mobility; content of the modified metal element on a side of the oxide semiconductor layer 20 away from the gate electrode 30 is relatively low, which is beneficial to improve stability and achieve an effect of multi-layer metal oxide semiconductor.

Specifically, the material of the oxide semiconductor layer 20 is selected from metal oxides, the metal oxide may specifically be a metal oxide containing aluminum, the aluminum is a modified metal element. For example, the material of the oxide semiconductor layer 20 is selected from at least one of aluminum zinc oxide and aluminum gallium zinc oxide. Of course, according to actual selection and specific requirements, the material of the oxide semiconductor layer 20 can also be a metal oxide containing other metal elements, which is not uniquely limited here.

Specifically, when the material of the oxide semiconductor layer 20 is selected from metal oxides containing aluminum, for example, the material of the oxide semiconductor layer 20 is selected from at least one of aluminum zinc oxide and aluminum gallium zinc oxide, at this time, proportion of aluminum in all the metal elements gradually decreases from the gate electrode 30 toward the oxide semiconductor layer 20.

Specifically, the metal oxide may be a metal oxide containing indium, indium is a modified metal element. For example, the material of the oxide semiconductor layer 20 is selected from at least one of indium zinc oxide, indium tin zinc oxide, and indium gallium zinc oxide. Of course, according to actual selection and specific requirements, the material of the oxide semiconductor layer 20 can also be a metal oxide containing other metal elements, which is not uniquely limited here.

Specifically, when the material of the oxide semiconductor layer 20 is selected from metal oxides containing indium, for example, the material of the oxide semiconductor layer 20 is selected from at least one of indium zinc oxide, indium tin zinc oxide, and indium gallium zinc oxide, at this time, proportion of indium in all metal elements gradually decreases from the gate electrode 30 toward the oxide semiconductor layer 20.

Specifically, as shown in FIG. 1, the array substrate of the embodiment of the present disclosure may be a bottom gate structure, the array substrate further includes a gate electrode insulating layer 40, a source electrode 51, and a drain electrode 52. The gate electrode 30 is disposed on the substrate 10, the gate electrode insulating layer 40 is disposed on the substrate 10 and covers the gate electrode 30. The oxide semiconductor layer 20 is disposed on the gate electrode insulating layer 40, the oxide semiconductor layer 20 is disposed corresponding to the gate electrode 30. The source electrode 51 and the drain electrode 52 are disposed at interval on the gate electrode insulating layer 40 and the oxide semiconductor layer 20. The source electrode 51 connects to one end of the oxide semiconductor layer 20 through a via hole, the drain electrode 52 connects to another end of the oxide semiconductor layer 20 through a via hole.

It can be understood that the specific structure of the array substrate in the embodiment of the present disclosure can be appropriately modified according to selection of an actual situation and a setting of specific requirements, which is not limited here. For example, as shown in FIG. 2, the array substrate may be a top gate structure. The array substrate further includes a gate electrode insulating layer 40, an interlayer insulating layer 60, a source electrode 51, and a drain electrode 52. The oxide semiconductor layer 20 is disposed on the substrate 10, the gate electrode insulating layer 40 is disposed on the oxide semiconductor layer 20, the gate electrode 30 is disposed on the gate electrode insulating layer 40. The interlayer insulating layer 60 covers the gate electrode 30, the gate electrode insulating layer 40, and the oxide semiconductor layer 20. The source electrode 51 and the drain electrode 52 are disposed on the interlayer insulating layer 60, the source electrode 51 connects to one end of the oxide semiconductor layer 20 through a via hole, the drain electrode 52 connects to another end of the oxide semiconductor layer 20 through a via hole.

Specifically, the oxide semiconductor layer 20 includes a channel region 21. The channel region 21 includes a stacked front channel 211 and a back channel 212, the front channel 211 is located on a side of the back channel 212 close to the gate electrode 30. In the channel region 21, proportion of the modified metal element in all the metal elements gradually decreases from the front channel 211 toward the back channel 212.

In the channel region 21, the proportion of the modified metal element in all the metal elements gradually decreases from the front channel 211 to the back channel 212. That is, a ratio of mass of the modified metal element to total mass of all the metal elements gradually decreases from the front channel 211 to the back channel 212. For example, when the material of the oxide semiconductor layer 20 includes the modified metal element and a first metal element, a ratio of the mass of the modified metal element to the total mass of all the metal elements (sum of the mass of the modified metal element and the mass of the first metal element) is the proportion of the modified metal element in all the metal elements. In the present embodiment, the material of the oxide semiconductor layer 20 includes at least two metal elements, that is, the material of the oxide semiconductor layer 20 may include two, three or more metal elements, which is not uniquely limited here.

Figure 3:
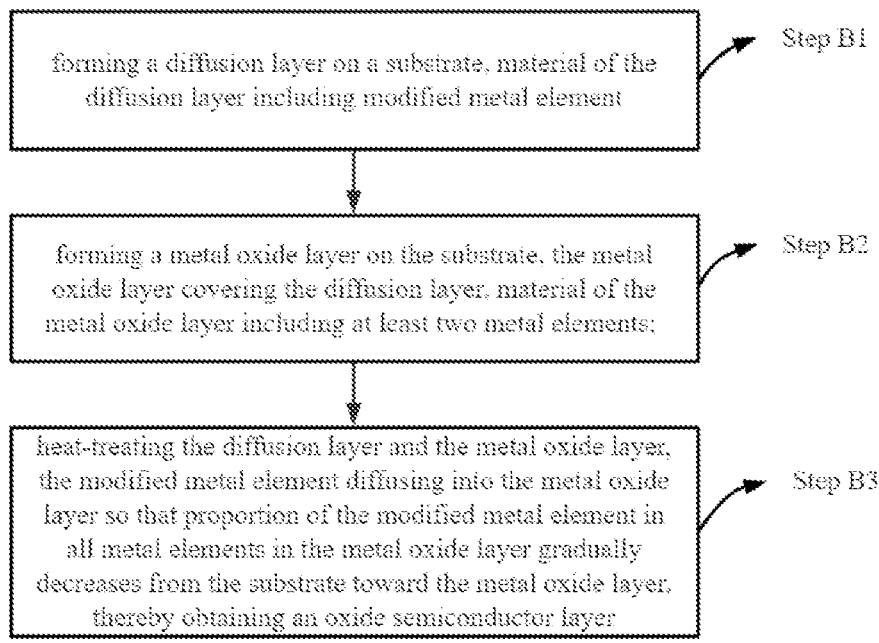
FIG. 3 is a schematic flowchart of a method for manufacturing the first array substrate according to an embodiment of the present disclosure.
Figure 4:
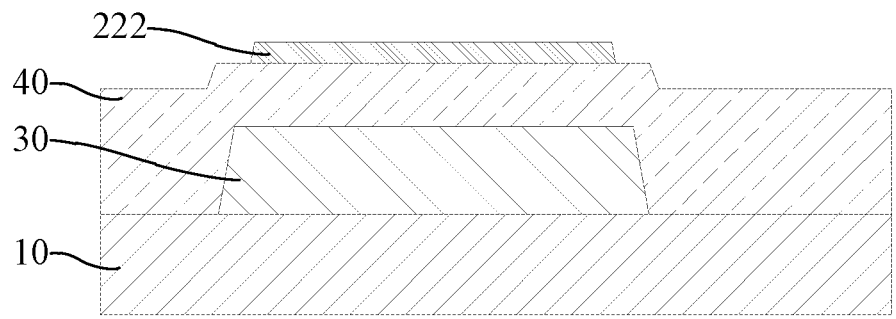
FIG. 4 is a schematic diagram of sequentially forming a gate electrode, a gate electrode insulating layer, and a metal layer on a substrate according to an embodiment of the present disclosure.
Figure 5:
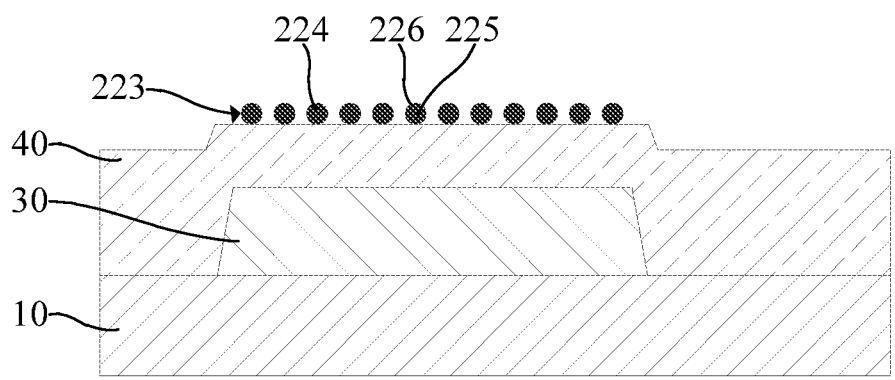
FIG. 5 is a schematic diagram of converting the metal layer into a diffusion layer according to an embodiment of the present disclosure.
Figure 6:
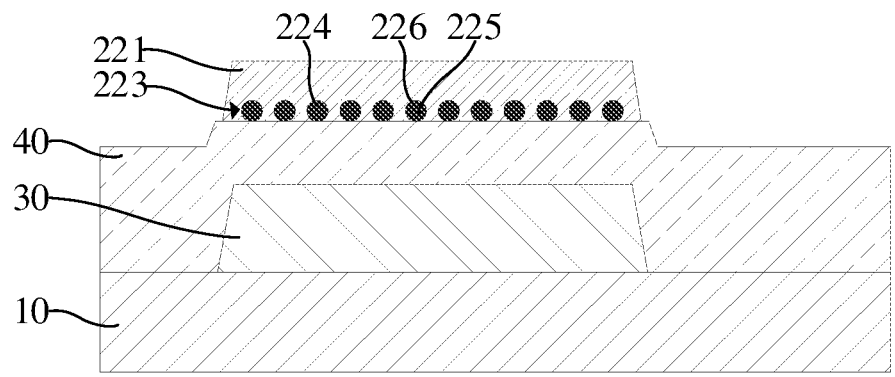
FIG. 6 is a schematic diagram of forming a metal oxide layer on the diffusion layer according to an embodiment of the present disclosure.
Figure 7:
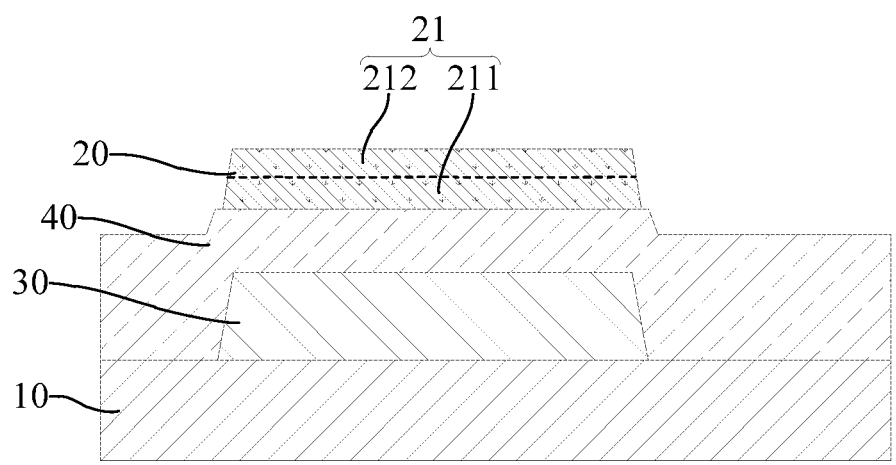
FIG. 7 is a schematic diagram of heat-treatment of the diffusion layer and the metal oxide layer on the diffusion layer to form an oxide semiconductor layer according to an embodiment of the present disclosure.

Referring to FIG. 3, an embodiment of the present disclosure also provides a method for manufacturing an array substrate used to manufacture the array substrate, the method for manufacturing the array substrate includes the following steps:

Step B1, as shown in FIG. 4 and FIG. 5, forming a diffusion layer 223 on the substrate 10, the diffusion layer 223 including a modified metal element;

Step B2, as shown in FIG. 6, forming a metal oxide layer 221 on the substrate 10, the metal oxide layer 221 covering the diffusion layer 223, material of the metal oxide layer 221 including at least two metal elements, and may specifically be, but not limited to be, obtained by deposition and patterning to obtain the metal oxide layer 221;

Step B3, as shown in FIG. 7, heat-treating the diffusion layer 223 and the metal oxide layer 221, the modified metal element diffusing into the metal oxide layer 221 so that the proportion of the modified metal element in the metal oxide layer 221 in all metal elements gradually decreases from the substrate 10 toward the metal oxide layer 221, thereby obtaining the oxide semiconductor layer 20.

In the method for manufacturing the array substrate according to the embodiment of the present disclosure, by heat-treating the diffusion layer 223 and the metal oxide layer 221, the modified metal element is diffused into the metal oxide layer 221. During diffusion process, content of the modified metal element on a side of the metal oxide layer 221 close to the diffusion layer 223 is high, content of the modified metal element on a side of the metal oxide layer 221 away from the diffusion layer 223 is low, so that the modified metal element in the metal oxide layer 221 forms a concentration gradient, thereby producing the oxide semiconductor layer 20.

In the prepared oxide semiconductor layer 20, the oxide semiconductor layer 20 includes a channel region 21, the channel region 21 includes a front channel 211 and a back channel 212, the front channel 211 is located on a side of the back channel 212 close to the gate electrode 30. In the channel region 21, proportion of modified metal element in all the metal elements gradually decreases from the front channel 211 to the back channel 212, that is, the modified metal element in the channel region 21 forms a concentration gradient. Specifically, content of the modified metal element in the front channel 211 is relatively high, which is beneficial to improve the mobility. Content of modified metal element in the back channel 212 is low, which is beneficial to improve stability and achieve an effect of a multi-layer metal oxide semiconductor.

Specifically, the above step B1 includes:

step B11, forming a metal layer 222 on the substrate 10, specifically, but not limited to, forming the metal layer 222 by physical vapor deposition method, patterning the metal layer 222, material of the metal layer 222 including a modified metal element;

step B12, heat-treating the metal layer 222, converting the metal layer 222 into a plurality of metal particles 224, and forming the diffusion layer 223. During heat-treating of the metal layer 222, crystal grains in the metal layer 222 will grow and accumulate into metal particles 224 arranged at intervals. The metal particle 224 includes an inner layer 225 and an outer layer 226, the outer layer 226 wraps the inner layer 225, material of the outer layer 226 is metal oxide, material of the inner layer 225 is metal. In the subsequent step B3, during high temperature baking process of the metal particles 224 and the metal oxide layer 221, crystal lattices of the metal particle 224 will induce a crystallization behavior of the metal oxide layer 221 so that the obtained oxide semiconductor layer 20 exhibits a slight crystallization phenomenon, reduces defect states, and improves stability of device.

Optionally, in the above step B11, the metal layer 222 is an aluminum layer, the modified metal element is aluminum. In the step B2, the material of the metal oxide layer 221 is selected from at least one of aluminum zinc oxide and aluminum gallium zinc oxide. In the present embodiment, material of the outer layer 226 of the metal particle 224 obtained in the step B12 can be aluminum oxide, and the material of the inner layer 225 is aluminum.

Optionally, in the above step B11, the metal layer 222 is an indium layer, the modified metal element is indium. In the step B2, the material of the metal oxide layer 221 is selected from at least one of indium zinc oxide, indium tin zinc oxide, and indium gallium zinc oxide. In the present embodiment, the material of the outer layer 226 of the metal particle 224 obtained in the step B12 can be indium oxide, and the material of the inner layer 225 is indium.

It can be understood that the material of the metal layer 222 and the material of the metal oxide layer 221 can be appropriately modified according to actual selections and specific requirements, which are not limited here.

Specifically, in the above step B12, temperature range for heat-treatment of the metal layer 222 is from 150 degrees Celsius to 350 degrees Celsius, time period ranges from 10 minutes to 2 hours. Specific operation of the above step B12 may be: heating the metal layer 222 for 10 minutes to 2 hours in an air environment of 150 degrees Celsius to 350 degrees Celsius.

Specifically, if the metal layer 222 is too thick, excessive diffusion layer 223 will be formed. During the heat-treatment of the diffusion layer 223 and the metal oxide layer 221 in step B3, the diffusion layer 223 cannot be completely diffused into the metal oxide layer 221, which results in the diffusion layer 223 of metal material still being on one side of the obtained oxide semiconductor layer 20, which will cause subsequent formation of the thin film transistor to be turned on but cannot be turned off, resulting in an abnormality. In order to avoid the above problems, in the above step B11, thickness of the metal layer 222 is less than or equal to 10 nanometers. In this thickness range, the technical problems of poor stability and low mobility of the metal oxide thin film transistor can be solved, at a same time, the diffusion layer 223 of the metal material still existing under the oxide semiconductor layer 20 after the subsequent step B3 is avoided.

Specifically, in the above step B3, temperature range for heat-treatment of the diffusion layer 223 and the metal oxide layer 221 is from 250 degrees Celsius to 450 degrees Celsius, time period ranges from 10 minutes to 2 hours. A specific operation of the above step B3 may be: heating the diffusion layer 223 and the metal oxide layer 221 for 10 minutes to 2 hours in an air environment of 250 degrees Celsius to 450 degrees Celsius.

Specifically, as shown in FIG. 4, before the step of forming the metal layer 222 on the substrate 10, the step B11 further includes:

forming a gate electrode 30 and a gate electrode insulating layer 40 sequentially on the substrate 10. The gate electrode insulating layer 40 is disposed on the substrate 10 and covers the gate electrode 30, the subsequently formed metal layer 222 is disposed on the gate electrode insulating layer 40, the metal layer 222 and the gate electrode 30 are disposed correspondingly, and the metal layer 222 and the gate electrode 30 are at least partially overlapping.

Specifically, as shown in FIG. 1 and FIG. 7, after the above step B3, the method for manufacturing the array substrate further includes:

forming a source electrode 51 and a drain electrode 52 on the gate electrode insulating layer 40 and the oxide semiconductor layer 20. The source electrode 51 and the drain electrode 52 arranged at interval, the source electrode 51 connecting to one end of the oxide semiconductor layer 20 through a via hole, the drain electrode 52 connecting to another end of the oxide semiconductor layer 20 through a via hole.

Figure 8:
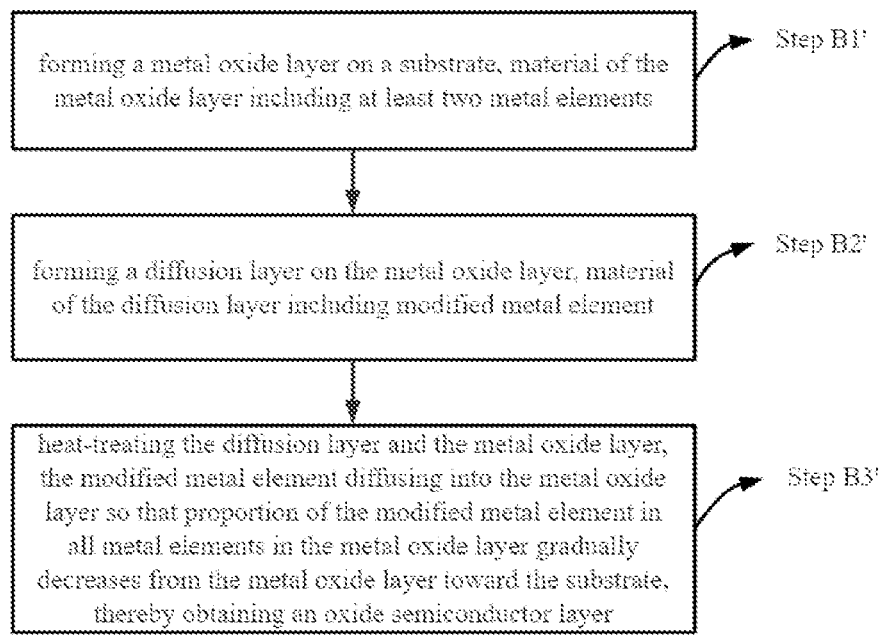
FIG. 8 is a schematic flowchart of a method for manufacturing the second array substrate according to an embodiment of the present disclosure.
Figure 9:
FIG. 9 is a schematic diagram of sequentially forming the metal oxide layer and the metal layer on the substrate according to an embodiment of the present disclosure.
Figure 10:
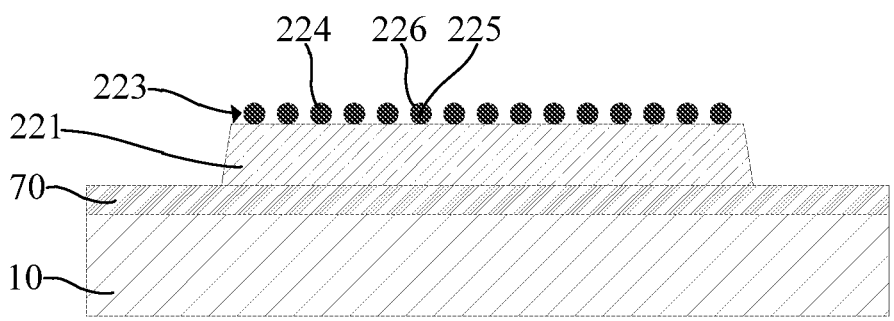
FIG. 10 is a schematic diagram of converting the metal layer on the metal oxide layer into the diffusion layer according to an embodiment of the present disclosure.
Figure 11:
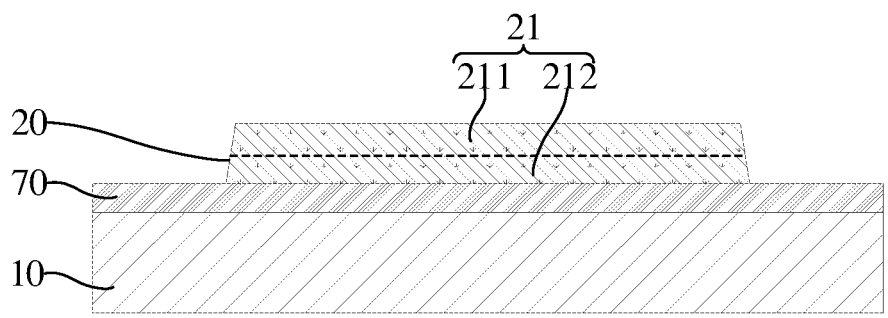
FIG. 11 is a schematic diagram of heat-treatment of the metal oxide layer and the diffusion layer on the metal oxide layer to form the oxide semiconductor layer according to an embodiment of the present disclosure.

Referring to FIG. 8, an embodiment of the present disclosure further provides a method for manufacturing an array substrate, which is used for manufacturing the above-mentioned array substrate, the method for manufacturing the array substrate includes following steps:

step B1', as shown in FIG. 9, forming a metal oxide layer 221 on the substrate 10, material of the metal oxide layer 221 including at least two metal elements, specifically forming the metal oxide layer 221 by deposition and patterning;

step B2', as shown in FIG. 9 and FIG. 10, forming a diffusion layer 223 on the metal oxide layer 221, the diffusion layer 223 including a modified metal element;

step B3', as shown in FIG. 11, heat-treating the diffusion layer 223 and the metal oxide layer 221, the modified metal element diffusing into the metal oxide layer 221 so that a proportion of the modified metal element in all metal elements in the metal oxide layer 221 gradually decreases from the metal oxide layer 221 toward the substrate 10, thereby obtaining an oxide semiconductor layer 20.

In the method for manufacturing the array substrate according to the embodiment of the present disclosure, by heat-treating the diffusion layer 223 and the metal oxide layer 221, the modified metal element diffuses into the metal oxide layer 221. During the diffusion process, the content of the modified metal element on the side of the metal oxide layer 221 close to the diffusion layer 223 is high, the content of the modified metal element on the side of the metal oxide layer 221 away from the diffusion layer 223 is low so that the modified metal element in the metal oxide layer 221 forms a concentration gradient, thereby producing the oxide semiconductor layer 20.

In the prepared oxide semiconductor layer 20, the oxide semiconductor layer 20 includes a channel region 21, the channel region 21 includes a front channel 211 and a back channel 212, the front channel 211 is located on a side of the back channel 212 close to the gate electrode 30. In the channel region 21, proportion of modified metal element in all the metal elements gradually decreases from the front channel 211 to the back channel 212, that is, the modified metal element in the channel region 21 forms a concentration gradient. Specifically, content of the modified metal element in the front channel 211 is relatively high, which is beneficial to improve mobility. Content of modified metal element in the back channel 212 is low, which is beneficial to improve stability and achieve an effect of a multi-layer metal oxide semiconductor.

Specifically, the above step B2' includes:

step B21', forming a metal layer 222 on the metal oxide layer 221, specifically, but not limited to, forming the metal layer 222 by physical vapor deposition method, patterning the metal layer 222, material of the metal layer 222 including a modified metal element;

step B22', heat-treating the metal layer 222, conveting the metal layer 222 into a plurality of metal particles 224, and forming the diffusion layer 223. During heat-treating the metal layer 222, crystal grains in the metal layer 222 will grow and accumulate into metal particles 224 arranged at intervals. The metal particle 224 includes an inner layer 225 and an outer layer 226, the outer layer 226 wraps the inner layer 225, material of the outer layer 226 is metal oxide, material of the inner layer 225 is metal. In the subsequent step B3, during high temperature baking process of the metal particles 224 and the metal oxide layer 221, crystal lattice of the metal particle 224 will induce a crystallization behavior of the metal oxide layer 221 so that the obtained oxide semiconductor layer 20 exhibits a slight crystallization phenomenon, reduces defect states, and improves stability of device.

Optionally, in the above step B21', the metal layer 222 is an aluminum layer, the modified metal element is aluminum. In the step B1', the material of the metal oxide layer 221 is selected from at least one of aluminum zinc oxide and aluminum gallium zinc oxide. In the present embodiment, material of the outer layer 226 of the metal particle 224 obtained in the step B22' can be aluminum oxide, and the material of the inner layer 225 is aluminum.

Optionally, in the above step B21', the metal layer 222 is an indium layer, the modified metal element is indium. In the step B1', the material of the metal oxide layer 221 is selected from at least one of indium zinc oxide, indium tin zinc oxide, and indium gallium zinc oxide. In the present embodiment, the material of the outer layer 226 of the metal particle 224 obtained in the step B22' can be indium oxide, and the material of the inner layer 225 is indium.

It can be understood that the material of the metal layer 222 and the material of the metal oxide layer 221 can be appropriately modified according to actual selections and specific requirements, which are not limited here.

Specifically, in the above step B22', temperature range for heat-treatment of the metal layer 222 is from 150 degrees Celsius to 350 degrees Celsius, time period ranges from 10 minutes to 2 hours. Specific operation of the above step B22' may be: heating the metal layer 222 for 10 minutes to 2 hours in an air environment from 150 degrees Celsius to 350 degrees Celsius.

Specifically, if the metal layer 222 is too thick, excessive diffusion layer 223 will be formed. During the heat-treatment of the diffusion layer 223 and the metal oxide layer 221 in step B3, the diffusion layer 223 cannot be completely diffused into the metal oxide layer 221, which results in the diffusion layer 223 of metal material still being on one side of the obtained oxide semiconductor layer 20, which will cause subsequent formation of the thin film transistor to be turned on but cannot be turned off, resulting in an abnormality. In order to avoid the above problems, in the above step B21', thickness of the metal layer 222 is less than or equal to 10 nanometers. In this thickness range, the technical problems of poor stability and low mobility of the metal oxide thin film transistor can be solved, at a same time, the diffusion layer 223 of the metal material still existing under the oxide semiconductor layer 20 after the subsequent step B3 is avoided.

Specifically, in the above step B3, the temperature range for heat-treatment of the diffusion layer 223 and the metal oxide layer 221 is from 250 degrees Celsius to 450 degrees Celsius, time period range from 10 minutes to 2 hours. A specific operation of the above step B3 may be: heating the diffusion layer 223 and the metal oxide layer 221 for 10 minutes to 2 hours in an air environment of 250 degrees Celsius to 450 degrees Celsius.

Specifically, as shown in FIG. 9, before forming the metal oxide layer 221 on the substrate 10, the step B1' further includes:

forming a buffer layer 70 on the substrate 10, the subsequent formed metal oxide layer 221 formed on the buffer layer 70, in this setting way, adhesion of the metal oxide layer 221 improved so that the metal oxide layer 221 is stably disposed on the buffer layer 70.

Figure 12:
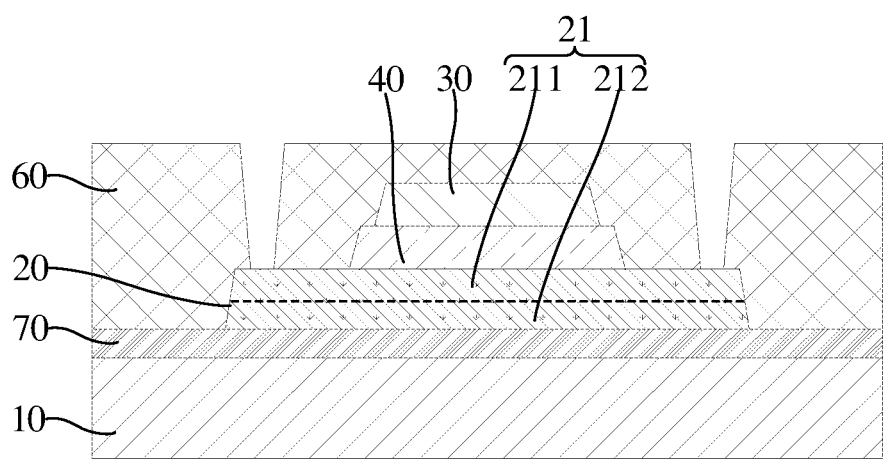
FIG. 12 is a schematic diagram of sequentially forming the gate electrode insulating layer and the gate electrode on the oxide semiconductor layer according to an embodiment of the present disclosure.

Specifically, as shown in FIG. 2 and FIG. 12, after the above step B3', the method for manufacturing the array substrate further includes:

forming a gate electrode insulating layer 40 and a gate electrode 30 on the oxide semiconductor layer 20, sequentially, projection of the gate electrode 30 and projection of the oxide semiconductor layer 20 on the substrate 10 at least partially overlaps;

forming an interlayer insulating layer 60 on the gate electrode 30 and the oxide semiconductor layer 20, the interlayer insulating layer 60 covering the gate electrode 30, the gate electrode insulating layer 40, and the oxide semiconductor layer 20;

forming a source electrode 51 and a drain electrode 52 on the interlayer insulating layer 60, the source electrode 51 and the drain electrode 52 arranged at interval, the source electrode 51 connecting to one end of the oxide semiconductor layer 20 through a via hole, the drain electrode 52 connecting to another end of the oxide semiconductor layer 20 through a via hole.

TABLE 1

Device performance of conventional thin film transistor and thin film transistor of an embodiment of the present disclosure.

| | | conventional thin film transistor | thin film transistor of an embodiment of the present disclosure |
|---|---|---|---|
| Oxide target composition | | Al/(Al + Ga + Zn) = 0.3 Ga/(Al + Ga + Zn) = 0.3 Zn/(Al + Ga + Zn) = 0.4 | Al/(Al + Ga + Zn) = 0.3 Ga/(Al + Ga + Zn) = 0.3 Zn/(Al + Ga + Zn) = 0.4 |
| thin film transistor | gate electrode insulating layer | $Al_2O_3$ | $Al_2O_3$ |
| | source electrode/ drain electrode | Mo/Cu | Mo/Cu |
| | threshold voltage (Vth) | 1.6 | 0.8 |
| | mobility ($cm^2$/Vs) | 10.6 | 18.5 |
| | threshold voltage drift (V) under NBTIS | −1.2 | −0.6 |

It can be seen from Table 1, the thin film transistors of the array substrate of the embodiments of the present disclosure have higher mobility and better stability than the conventional thin film transistors.

Figure 13:
FIG. 13 is a schematic structural diagram of a display device according to an embodiment of the present disclosure.

Referring to FIG. 13, an embodiment of the present disclosure further provides a display device. The display device includes an opposing substrate 200, a liquid crystal layer 300, and the array substrate 100 as described above. The opposing substrate 200 and the array substrate 100 are arranged at interval, the liquid crystal layer 300 is arranged between the opposing substrate 200 and the array substrate 100.

The array substrate, the method for manufacturing the array substrate, and the display device provided by the embodiments of the present disclosure have been described in detail above. The principles and implementations of the present disclosure are described herein using specific examples, the descriptions of the above embodiments are only used to help understand the methods and core ideas of the present disclosure. At the same time, for those skilled in the art, according to the idea of the present disclosure, there will be changes in the specific embodiments and application scope. In summary, the content of the specification should not be construed as a limitation to the present disclosure.

What is claimed is:

1. An array substrate, comprising:
    a substrate;
    an oxide semiconductor layer;
    a gate electrode, the gate electrode and the oxide semiconductor layer are arranged on a same side of the substrate, a projection of the gate electrode on the substrate at least partially overlapping a projection of the oxide semiconductor layer on the substrate, and the gate electrode and the oxide semiconductor layer are arranged in different layer levels;
    wherein a material of the oxide semiconductor layer comprises at least two metal elements and at least one of aluminum zinc oxide and aluminum gallium zinc oxide, the at least two metal elements comprises a modified metal element,
    the modified metal element is aluminum, and a proportion of aluminum in the at least two metal elements gradually decreases from the gate electrode toward the oxide semiconductor layer.

2. The array substrate as claimed in claim 1, wherein the material of the oxide semiconductor layer comprises at least two metal elements and at least one of indium zinc oxide, indium tin zinc oxide, and indium gallium zinc oxide; the modified metal element is indium, a proportion of indium in the at least two metal elements gradually decreases from the gate electrode toward the oxide semiconductor layer.

3. The array substrate as claimed in claim 1, wherein the gate electrode is disposed on the substrate, the array substrate further comprising:
a gate electrode insulating layer, disposed on the substrate and covering the gate electrode, the oxide semiconductor layer disposed on the gate electrode insulating layer; and
a source electrode and a drain electrode, spaced apart from each other and arranged on the gate electrode insulating layer and the oxide semiconductor layer, the source electrode connecting with one end of the oxide semiconductor layer, the drain electrode connecting with another end of the oxide semiconductor layer.

4. The array substrate as claimed in claim 1, wherein the oxide semiconductor layer is disposed on the substrate, the array substrate further comprising: a gate electrode insulating layer, disposed on the oxide semiconductor layer, the gate electrode disposed on the gate electrode insulating layer;
an interlayer insulating layer, covering the gate electrode, the gate electrode insulating layer, and the oxide semiconductor layer; and a source electrode and a drain electrode, disposed on the interlayer insulating layer, the source electrode connecting to one end of the oxide semiconductor layer, the drain electrode connecting to another end of the oxide semiconductor layer.

5. A method for manufacturing an array substrate, comprising the following steps:
forming a diffusion layer on a substrate, the diffusion layer comprising a modified metal element; forming a metal oxide layer on the substrate to cover the diffusion layer, a material of the metal oxide layer comprising at least two metal elements;
heat-treating the diffusion layer and the metal oxide layer to make the modified metal element diffuse into the metal oxide layer so that a proportion of the modified metal element in the at least two metal elements in the metal oxide layer gradually decreases from the substrate toward the metal oxide layer, thereby obtaining an oxide semiconductor layer,
wherein the modified metal element is aluminum, and the material of the metal oxide layer is selected from at least one of aluminum zinc oxide and aluminum gallium zinc oxide.

6. The method for manufacturing the array substrate as claimed in claim 5, wherein the step of forming the diffusion layer on the substrate comprises:
forming a metal layer on the substrate, a material of the metal layer comprising the modified metal element;
heat-treating the metal layer, the metal layer converting into a plurality of metal particles and forming the diffusion layer.

7. The method for manufacturing the array substrate as claimed in claim 6, wherein a thickness of the metal layer is less than or equal to 10 nanometers.

8. The method for manufacturing the array substrate as claimed in claim 6, wherein a temperature for heat-treating the metal layer ranges from 150 degrees Celsius to 350 degrees Celsius and for a time period range from 10 minutes to 2 hours.

9. The method for manufacturing the array substrate as claimed in claim 6, wherein the metal layer is an indium layer, the modified metal element is indium, the material of the metal oxide layer is selected from at least one of indium zinc oxide, indium tin zinc oxide, and indium gallium zinc oxide.

10. The method for manufacturing the array substrate as claimed in claim 5, wherein a temperature for heat-treating the diffusion layer and the metal oxide layer ranges from 250 degrees Celsius to 450 degrees Celsius for a time period range from 10 minutes to 2 hours.

11. A method for manufacturing an array substrate, comprising following the following steps:
forming a metal oxide layer on a substrate, a material of the metal oxide layer including at least two metal elements;
forming a diffusion layer on the metal oxide layer, the diffusion layer comprising a modified metal element;
heat-treating the diffusion layer and the metal oxide layer, the modified metal element diffusing into the metal oxide layer so that a proportion of the modified metal element in the at least two metal elements in the metal oxide layer gradually decreases from the metal oxide layer toward the substrate, thereby obtaining an oxide semiconductor layer,
wherein the modified metal element is aluminum, and the material of the metal oxide layer is selected from at least one of aluminum zinc oxide and aluminum gallium zinc oxide.

12. The method for manufacturing the array substrate as claimed in claim 11, wherein the step of forming the diffusion layer on the metal oxide layer comprises:
forming a metal layer on the metal oxide layer, a material of the metal layer including the modified metal element;
heat-treating the metal layer, and converting the metal layer into a plurality of metal particles and forming the diffusion layer.

13. The method for manufacturing the array substrate as claimed in claim 12, wherein a thickness of the metal layer is less than or equal to 10 nanometers.

14. The method for manufacturing the array substrate as claimed in claim 12, wherein a temperature for heat-treating the metal layer ranges from 150 degrees Celsius to 350 degrees Celsius and a time period for heat-treating the metal layer ranges from 10 minutes to 2 hours.

15. The method for manufacturing the array substrate as claimed in claim 12, wherein the metal layer is an indium layer, the modified metal element is indium, and the material of the metal oxide layer is selected from at least one of indium zinc oxide, indium tin zinc oxide, and indium gallium zinc oxide.

16. The method for manufacturing the array substrate as claimed in claim 11, wherein a temperature for heat-treating the diffusion layer and the metal oxide layer ranges from 250 degrees Celsius to 450 degrees Celsius for a time period range from 10 minutes to 2 hours.

* * * * *